United States Patent [19]
Redfern

[11] Patent Number: 5,355,135
[45] Date of Patent: Oct. 11, 1994

[54] SEMI-FLASH A/D CONVERTER USING SWITCHED CAPACITOR COMPARATORS

[75] Inventor: Thomas P. Redfern, San Jose, Calif.

[73] Assignee: Linear Technology Corporation, Milpitas, Calif.

[21] Appl. No.: 304,963

[22] Filed: Jan. 30, 1989

[51] Int. Cl.[5] .................. H03M 1/36; H03M 1/44; H03M 1/50

[52] U.S. Cl. .................. 341/156; 341/159; 341/172

[58] Field of Search ............... 341/156, 159, 172, 155, 341/158

[56] References Cited

U.S. PATENT DOCUMENTS

| | | | |
|---|---|---|---|
| 4,124,844 | 11/1978 | Black et al. | 341/156 |
| 4,639,715 | 1/1987 | Doluca | 341/156 |
| 4,658,198 | 4/1987 | Thurber, Jr. | 341/155 |
| 4,748,440 | 5/1988 | Kobayashi | 341/158 |
| 4,827,191 | 5/1989 | Chapman | 341/156 |

*Primary Examiner*—Sharon D. Logan
*Attorney, Agent, or Firm*—Flehr, Hohbach, Test, Albritton & Herbert

[57] ABSTRACT

Comparators for use in a semi-flash analog-to-digital converter utilize switched capacitor inputs for effecting a subtraction of charge corresponding to the subtraction of voltages to obtain the most significant bit comparisons and least significant bit comparisons. In a preferred embodiment, a 6-input switched-capacitor comparator is employed in which an analog input signal, a most significant reference TAP, and the output from a digital-to-analog converter are sequentially coupled through a first capacitor to the input of an inverting amplifier. A second plurality of input terminals sequentially connects one-half the least significant bit reference potential, 0 volts, and a least significant reference voltage TAP through second capacitive means to the input of the inverting amplifier. One comparator can thereby perform both a most significant bit comparison and a least significant bit comparison in a semi-flash mode of operation.

5 Claims, 3 Drawing Sheets

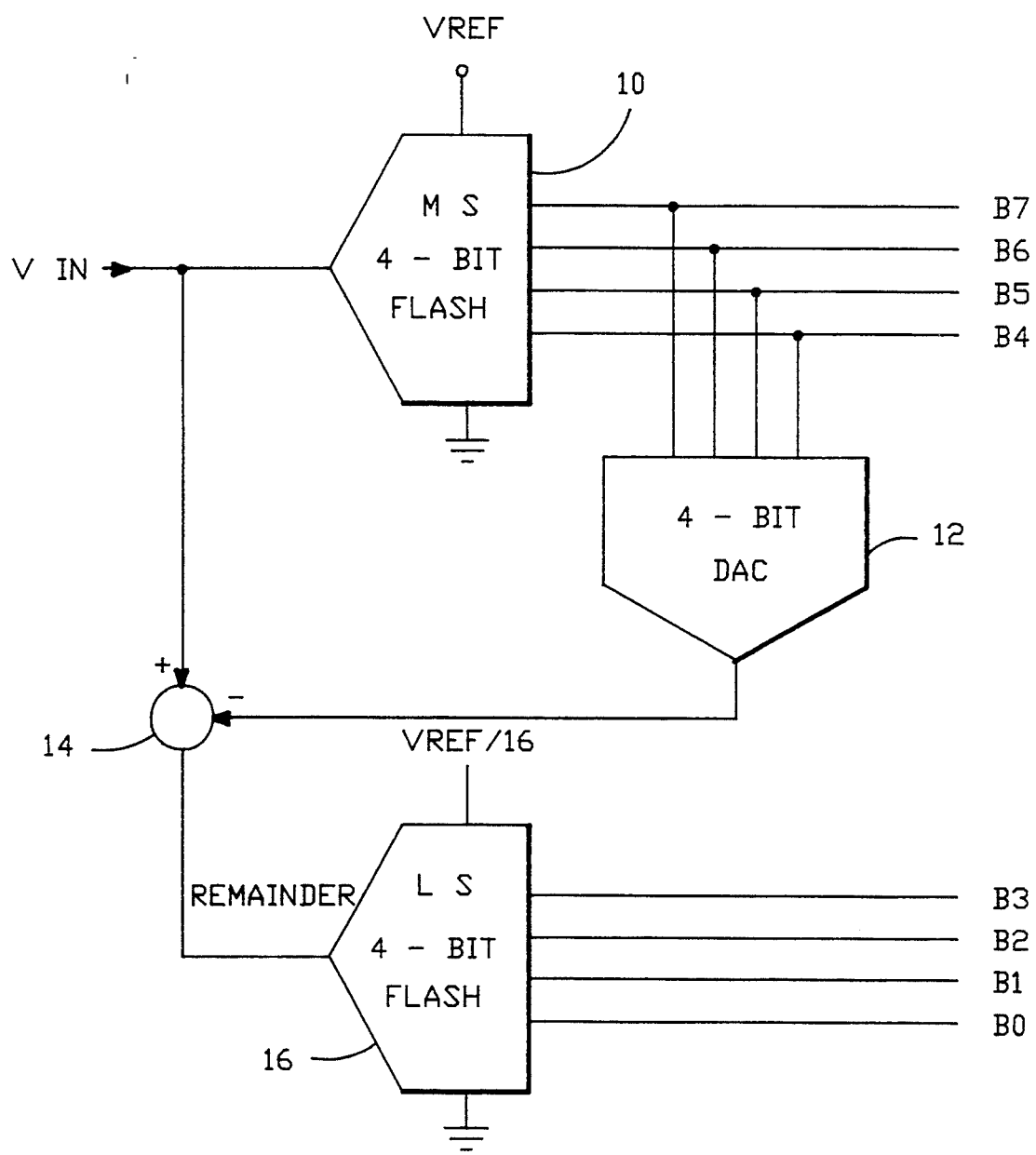
( PRIOR ART )
FIG.—1
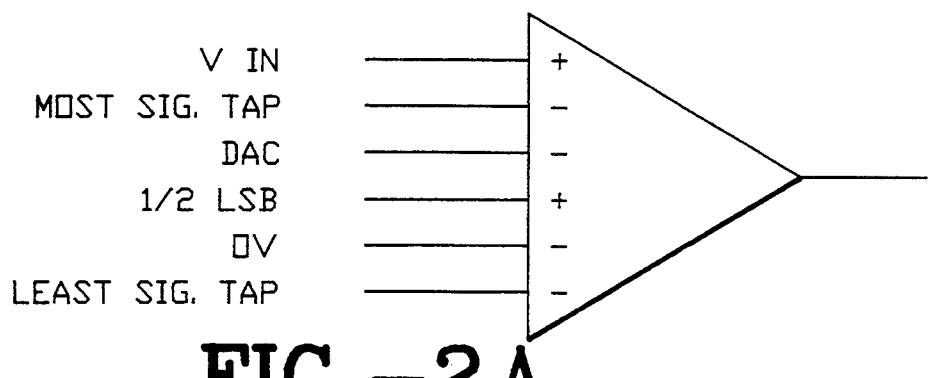
FIG.—2A

SEMI-FLASH A/D CONVERTER USING SWITCHED CAPACITOR COMPARATORS

BACKGROUND OF THE INVENTION

This invention relates generally to analog-to-digital (A/D) converters, and more particularly, the invention relates to semi-flash A/D converters.

In converting an analog signal to an N-bit digital signal, a full flash converter requires $2^N-1$ comparators. For example, an 8-bit digital signal requires 255 comparators for full flash conversion. The 255 comparators are tied to a 256 resistor ladder which provides the voltage reference corresponding to the 256 voltage levels represented by the 8-bit digital signal.

A two-step or semi-flash A/D converter can reduce the number of comparators required for an 8-bit digital signal from 255 to 31. In obtaining the 8-bit signal, two 4-bit flash conversions are made in sequence; first the four most significant bits are obtained and then the four least significant bits are obtained. After the most significant (M/S) 4-bit conversion, the four bits are converted to analog form and subtracted from the input signal, $V_{IN}$. The remainder is then applied to a second 4-bit converter to get the least significant (L/S) bits. The four M/S bits are then combined with the four L/S bits as the 8-bit digital number.

The advantage of the semi-flash conversion is the reduction in hardware as compared to a full-flash converter. The architecture can be further simplified by reusing the M/S flash converter to do the L/S flash conversion. This is possible since the M/S flash and the L/S flash occur at different times. The output of the M/S conversion could be latched while the L/S conversion is performed, thus providing a continuous D/A output. However, while the concept of reusing the M/S converter for the L/S conversion is conceptually simple, from a hardware point of view the concept is impractical using conventional A/D converters and comparators.

SUMMARY OF THE INVENTION

An object of the present invention is a semi-flash A/D converter using a reduced number of comparators.

Another object of the invention is a voltage comparator which can be used in a semi-flash mode of operation to obtain both a M/S bit and a L/S bit for a digital conversion.

A feature of the invention is a 6-input switched-capacitor comparator for use in accomplishing a semi-flash conversion of an analog signal to a digital signal.

Briefly, a M/S bit and an L/S bit are sequentially obtained using a single comparator comprising a 6-input switched capacitor operational amplifier. Three inputs are switchably, capacitively coupled to the amplifier input through a first capacitor, and three inputs are switchably, capacitively coupled to the amplifier input through a second capacitor. The input terminal of the amplifier acts as a virtual ground in which charges simultaneously coupled thereto are summed, and charges sequentially applied thereto are subtracted. The capacitors function as a sample-and-hold network in retaining the input signal for both the M/S and the L/S comparisons.

The invention and objects and features thereof will be more readily apparent with the following detailed description and appended claims when taken with the drawing.

BRIEF DESCRIPTION OF THE DRAWINGS

FIG. 1 is a functional block diagram of a conventional semi-flash A/D converter.

FIG. 2A and FIG. 2B are a symbolic diagram and a schematic diagram, respectively, of a 6-input switched capacitor comparator in accordance with the present invention.

DETAILED DESCRIPTION OF ILLUSTRATIVE EMBODIMENT

FIG. 1 is a functional block diagram of a conventional semi-flash A/D converter for converting an analog input signal, $V_{IN}$, to an 8-bit digital output signal. A first 4-bit converter 10 receives a reference voltage $V_{ref}$ and the input voltage, $V_{IN}$, and in response thereto provides the four most significant (M/S) bits B4–B7 of the digital signal. During a second cycle the four most significant bits are converted to an analog signal by a 4-bit digital-to-analog converter 12, and the converted signal is then subtracted from $V_{IN}$ at 14. The remainder is then applied to a second 4-bit analog-to-digital converter 16 which also receives a reference signal of $V_{REF}/16$ and converts the analog remainder input signal to a 4-bit digital signal representing the least significant (L/S) bits B0–B3 of the 8-bit digital signal.

As noted above, a semi-flash A/D converter significantly reduces the number of comparators required for analog-to-digital conversion. As also noted above, a further reduction in the architecture could be made by reusing the M/S flash converter to do the L/S flash conversion. This is possible since the M/S flash and the L/S flash occur at different times. However, while the concept of reusing the M/S converter for the L/S converter is simple, from a hardware point of view the concept is impractical using conventional A/D converters and comparators.

Figure 2B:
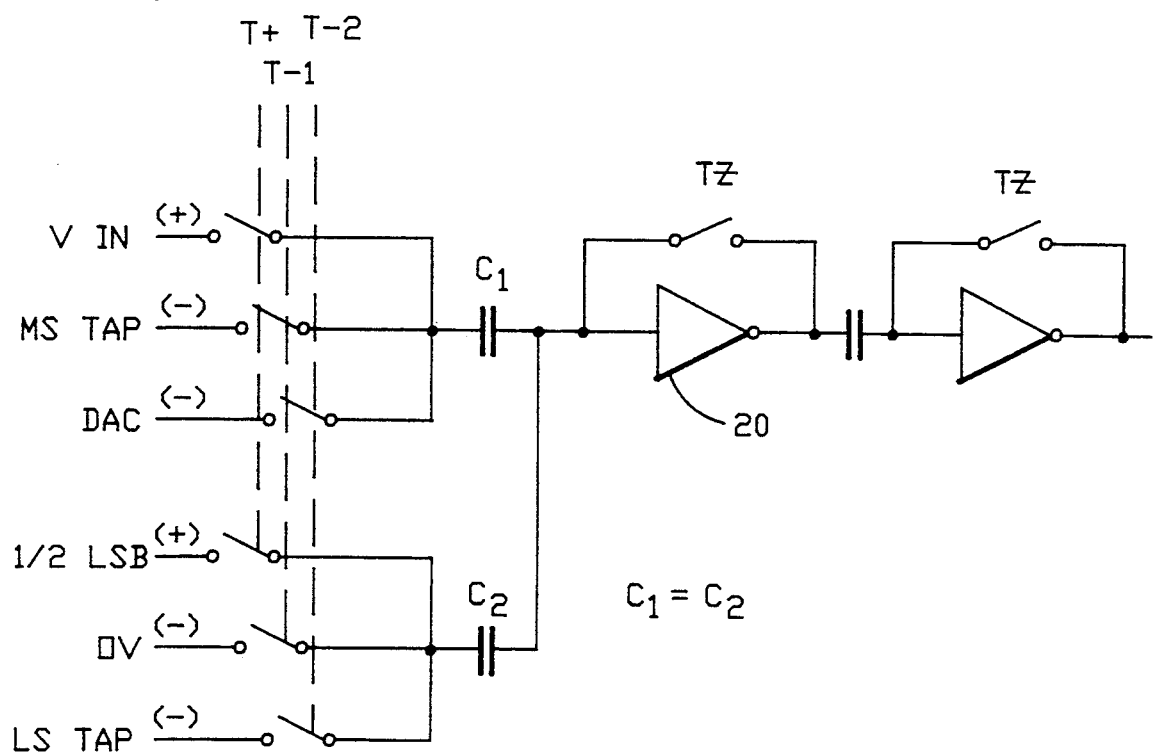
Figure 3:
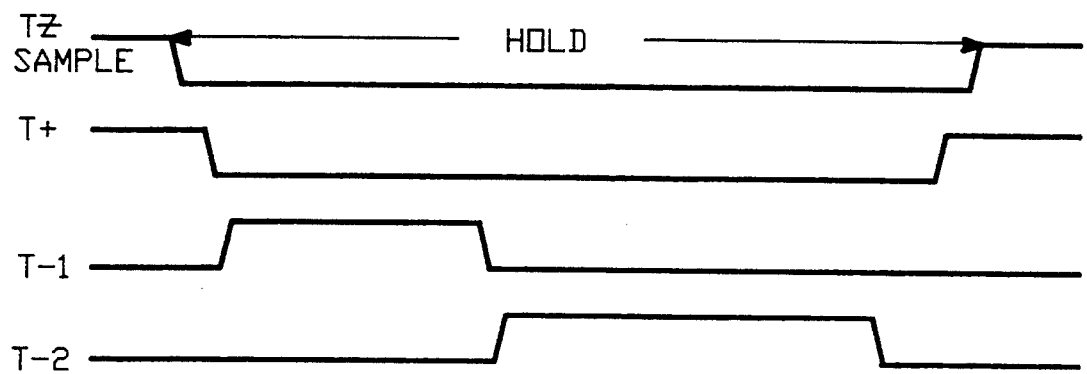
FIG. 3 is a timing diagram for the operation of the comparator of FIG. 2B.

In accordance with the present invention a semi-flash A/D converter is provided which reduces the number of comparators by employing the use of 6-input switched-capacitor comparators to accomplish a semi-flash conversion of an analog signal to a digital signal for both M/S bits and L/S bits. FIG. 2A and FIG. 2B are a symbolic diagram and a schematic diagram, respectively, of one of the 6-input switched-capacitor comparators. Three inputs, VIN, a M/S TAP, and a DAC TAP, are switchably coupled through capacitor C1 to the input of inverting amplifier 20. Three inputs including ½ LSB, OV, and an L/S TAP are switchably coupled through capacitor C2 to the input of inverting amplifier 20. The switches for the input signals are selectively closed during time periods T+, T−1, T−2 in accordance with the timing diagram of FIG. 3. Further, the feedback loop of inverting amplifier 20 is selectively closed during the time period TZ. During the time period when TZ is high, the T+ signal is high and the inputs $V_{IN}$ and ½ LSB are applied through capacitors C1 and C2 to the input of amplifier 20. The feedback loop is opened prior to removal of the two input signals, and the charge representing $V_{IN}+$½ LSB is held on capacitors C1 and C2, respectively.

During the first time period when the T+ and TZ switches are closed, the common node between capacitors C1 and C2 assumes an arbitrary bias voltage. Since the input capacitors effectively subtract out this voltage it may be considered to be a virtual ground. In this state, the input capacitor charges to $V_{IN}$. When $T_Z$ opens, the voltage $V_{IN}$ is held on capacitor C1.

In the next step the first comparison or M/S flash is performed. The M/S TAP is capacitively coupled through capacitor C1, and 0 volts is capacitively coupled through capacitor C2. The input capacitors, C1 and C2, convert the voltage difference between the (+) and (−) inputs to charge. This charge is summed at the virtual ground input of inverting amplifier 20. If $V^{IN}+\frac{1}{2}$ LSB is greater than M/S TAP, the output of inverting amplifier 20 will swing low. If $V^{IN}+\frac{1}{2}$ LSB is less than M/S TAP, the output of inverting amplifier 20 will swing high.

In an 8-bit converter, there are 16 identical comparators each tied to a TAP of a 16-resistor ladder. The M/S TAP voltages vary from $V_{REF}$ to 0 volts in steps of $V_{REF}$ divided by 16. It will be noted that capacitor C2 adds $\frac{1}{2}$ LSB to $V_{IN}$ to offset the converter transfer function by $\frac{1}{2}$ LSB, thereby equally distributing the 1-LSB quantization to $\pm\frac{1}{2}$ LSB.

In the last step, T-1 switches are open and the T-2 switches are closed. The capacitor C1 subtracts the 4-bit DAC approximation from $V_{IN}$ and inputs the difference charge into the virtual ground node. Because $V_{IN}$ is subtracted from the DAC using a single capacitor, the accuracy of the difference only depends on the DAC accuracy. As will be seen in FIG. 4, the same resistor ladder can be used to generate both the M/S TAP voltages and the DAC. All 16 comparators are switched to the same DAC voltage. Capacitor C2 converts the L/S TAP voltages to charge where it is compared to this remaining charge to effect the L/S flash.

Figure 4:
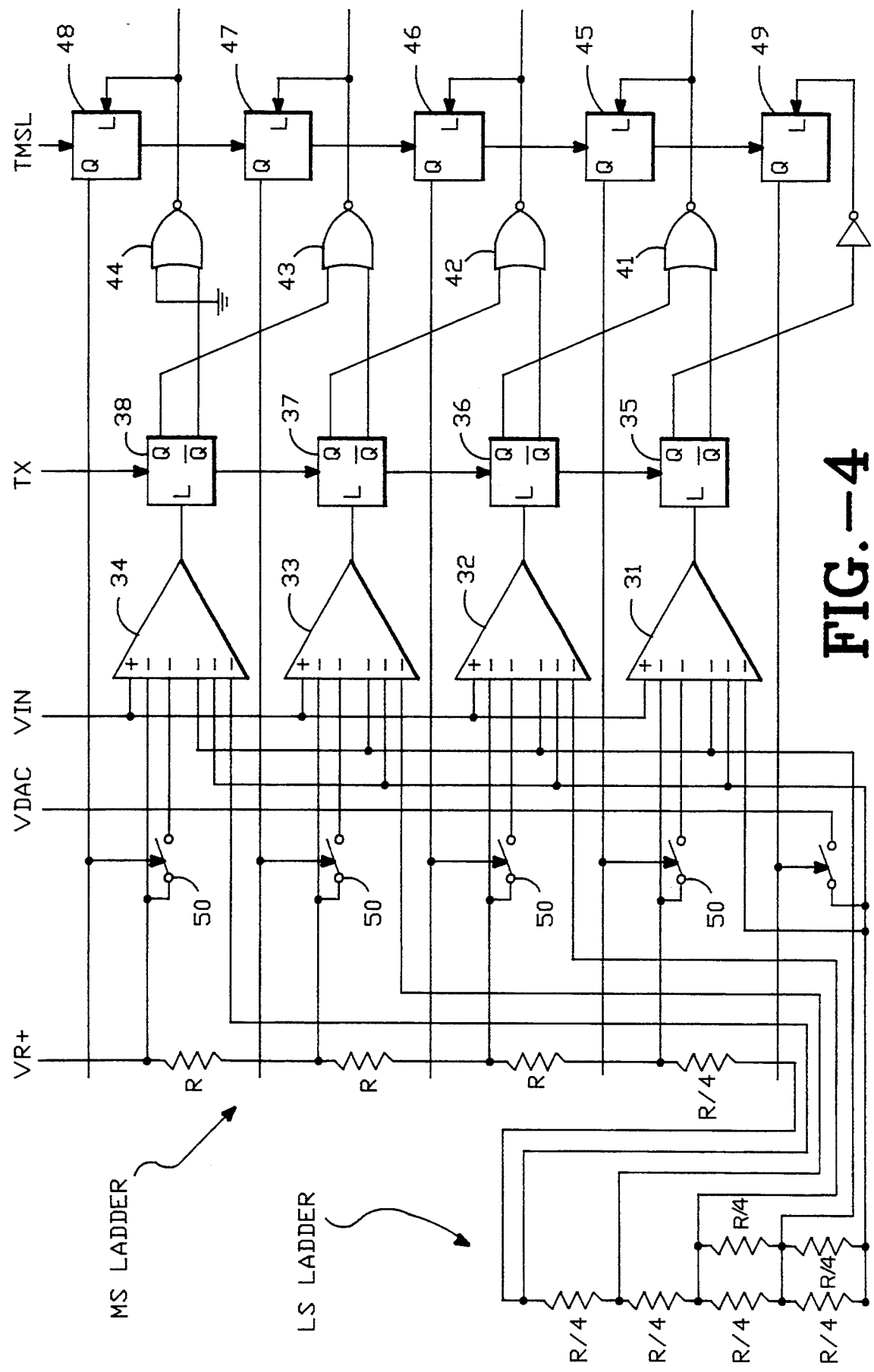
FIG. 4 is a schematic of a 4-bit semi-flash A/D converter using the comparator of FIGS. 2A and 2B.

FIG. 4 is a schematic of a 4-bit semi-flash analog-to-digital converter using the comparators of FIGS. 2A and 2B. For simplicity, a 4-bit semiflash is used as an example. Four reference levels for the M/S conversion are obtained from the resistors, R, of the M/S ladder, and four reference levels for the L/S comparison are obtained from the resistors, R/4, of the L/S resistor ladder. Following the M/S flash the output of the comparators 31–34 held in latches 35–38 are converted by logic NOR gates 41–44 to a binary voltage level which is stored, for the remainder of the conversion cycle, in latches 45–49. The outputs of the latches 45–48 are used to control switches 50 which effect a four-bit DAC. The output of this DAC is subtracted from $V_{IN}+\frac{1}{2}$ LSB as described previously.

The L/S flash is then accomplished using the L/S ladder inputs. In one embodiment the performance of the A/D converter is:

| | |
|---|---|
| Linearity error | $\pm\frac{1}{2}$ LSB |
| $V_{OS}$ | $\pm\frac{1}{2}$ LSB |
| Conversion Time | 2.5 μs |
| S/H Acquisition Time | 240 ns |
| S/H Tracking Rate | 2.5 v/μs |
| Max Sample Rate with 5 volts PP | 156 KHz |

There has been described an improved semi-flash A/D converter and switched-capacitor comparator useful therein. While the invention has been described with reference to a specific embodiment, the description is illustrative of the invention is not to be considered as limiting the invention. Various modifications and applications may occur to those skilled in the art without departing from the true spirit and scope of the invention as defined by the claims.

I claim:

1. An analog-to-digital comparator comprising:
 an inverting amplifier having an input, output, and a feedback loop between said output and said input, said feedback loop including a first switch;
 first and second capacitive means each connected to said input;
 a first plurality of input terminals each serially connected through second switches to said first capacitive means;
 a second plurality of input terminals each serially connected through third switches to said second capacitive means;
 said first plurality of said input terminals being connectable to an analog input signal, a most significant (M/S) reference voltage TAP, and a digital-to-analog converter (DAC) output;
 said second plurality of input terminals being connectable to a 0 voltage potential and a least significant (L/S) reference voltage TAP;
 whereby said capacitors convert input voltages to electrical charge, and said inverting amplifier responds to subtraction of charge in sequential closures of said second and third switches thereby providing sequential comparisons for a semi-flash A/D converter.

2. The analog-to-digital comparators described in claim 1 wherein said second plurality of input terminals are connectable to $\frac{1}{2}$ of the least significant bit value, whereby said comparator compares:

$$V_{IN}+\tfrac{1}{2} LSB = MS\ TAP + 0\ V,$$

and $$V_{IN}+\tfrac{1}{2} LSB - DAC = LS\ TAP.$$

3. A semi-flash analog-to-digital converter comprising:
 a first plurality of reference voltage TAPS (M/S);
 a second plurality of reference voltage TAPS (L/S);
 an analog input signal terminal;
 a digital-to-analog converter; and
 a plurality of analog-to-digital comparators for comparing an analog input signal to said first plurality of reference voltage TAPS and obtaining most significant bits (MSB) of a digital representation of said analog input signal, and for comparing the difference in the analog input signal and an analog signal converted from the most significant bits by said digital-to-analog converter, each of said analog-to-digital comparators including
 an inverting amplifier having an input, output, and a feedback loop between said output and said input, said feedback loop including a first switch;
 first and second capacitive means each connected to said input;
 a first plurality of input terminals each serially connected through second switches to said first capacitive means;
 a second plurality of input terminals each serially connected through third switches to said second capacitive means;
 said first plurality of input terminals being connectable to an analog input signal, a most significant (M/S) reference voltage TAP, and a digital-to-analog converter (DAC) output;

said second plurality of input terminals being connectable to a 0 voltage potential and a least significant (L/S) reference voltage TAP;

whereby said capacitors convert input voltages to electrical charge, and said inverting amplifier responds to subtraction of charge in sequential closures of said second third switches thereby providing sequential comparisons for a semi-flash A/D converter.

4. The semi-flash analog-to-digital converter defined by claim 3 wherein said second plurality of input terminals are conductible to ½ of the least significant bit value, whereby said comparator compares:

$$V_{IN} + \tfrac{1}{2} LSB = MS\ TAP + 0\ V,$$

and $$V_{IN} + \tfrac{1}{2} LSB - DAC = LS\ TAP.$$

5. A semi-flash analog-to-digital converter comprising:
a first plurality of most significant reference voltages;
a second plurality of least significant reference voltages;
an analog input signal terminal;
a digital-to-analog converter; and
a plurality of analog-to-digital comparators for first comparing an analog input signal to said first plurality of reference voltages and obtaining most significant bits (MSB) of a digital representation of said analog input signal, and for subsequently comparing the difference in the analog input signal and an analog signal converted from the most significant bits by said digital-to-analog converter to said second plurality of reference voltages and obtaining least significant bits (LSB) of a digital representation of said analog input signal, whereby to provide a digital representation of said input analog signal having most significant and least significant bits.

* * * * *